United States Patent
Grube et al.

(12)

(10) Patent No.: US 6,729,019 B2
(45) Date of Patent: May 4, 2004

(54) METHOD OF MANUFACTURING A PROBE CARD

(75) Inventors: Gary W. Grube, Pleasanton, CA (US); Igor Y. Khandros, Orinda, CA (US); Benjamin N. Eldridge, Danville, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 325 days.

(21) Appl. No.: 09/903,798

(22) Filed: Jul. 11, 2001

(65) Prior Publication Data

US 2003/0010976 A1 Jan. 16, 2003

(51) Int. Cl.$^7$ ................................................ H05K 3/36
(52) U.S. Cl. ........................ 29/830; 29/592.1; 29/593; 29/825; 29/832; 29/892
(58) Field of Search ............................... 29/890, 592.1, 29/593, 825, 832, 892

(56) References Cited

U.S. PATENT DOCUMENTS

| | | |
|---|---|---|
| 3,849,728 A | 11/1974 | Evans |
| 4,480,223 A | 10/1984 | Aigo |
| 4,567,432 A | 1/1986 | Buol et al. |
| 4,837,622 A | 6/1989 | Whann et al. |
| 4,899,099 A | 2/1990 | Mendenhall et al. |
| 4,983,907 A | 1/1991 | Crowley |
| 4,994,735 A | 2/1991 | Leedy |
| 5,090,118 A | 2/1992 | Kwon et al. |
| 5,103,557 A | 4/1992 | Leedy |
| 5,148,103 A | 9/1992 | Pasiecznik, Jr. |
| 5,162,728 A | 11/1992 | Huppenthal |
| 5,177,439 A | 1/1993 | Liu et al. |
| 5,185,502 A | 2/1993 | Shepherd et al. |
| 5,191,708 A | 3/1993 | Kasukabe et al. |
| 5,225,777 A | 7/1993 | Bross et al. |
| 5,308,443 A | 5/1994 | Sugihara |
| 5,399,982 A | 3/1995 | Driller et al. |
| 5,513,430 A | 5/1996 | Yanof et al. |
| 5,521,518 A | 5/1996 | Higgins |
| 5,534,784 A | 7/1996 | Lum et al. |
| 5,701,666 A | 12/1997 | DeHaven et al. |
| 5,736,850 A | 4/1998 | Legal |
| 5,806,181 A | 9/1998 | Khandros et al. |
| 5,821,763 A | 10/1998 | Beaman et al. |

(List continued on next page.)

FOREIGN PATENT DOCUMENTS

| | | |
|---|---|---|
| EP | 802419 A2 | 10/1997 |
| JP | 05-029406 | 2/1993 |
| JP | 06-050990 | 2/1994 |
| JP | 06-249924 | 9/1994 |
| JP | 08-015318 | 1/1996 |
| WO | WO 98/52224 | 11/1998 |
| WO | WO 00/33096 | 6/2000 |
| WO | WO 00/75677 | 12/2000 |

OTHER PUBLICATIONS

Leung et al., "Active Substrate Membrane Probe Card," Center For Integrated Systems Stanford Univeristy (Oct. 12, 1995).

*Primary Examiner*—Carl J. Arbes
(74) *Attorney, Agent, or Firm*—N. Kenneth Burraston; Stuart L. Merkadeau

(57) ABSTRACT

A method of designing and manufacturing a probe card assembly includes prefabricating one or more elements of the probe card assembly to one or more predefined designs. Thereafter, design data regarding a newly designed semiconductor device is received along with data describing the tester and testing algorithms to be used to test the semiconductor device. Using the received data, one or more of the prefabricated elements is selected. Again using the received data, one or more of the selected prefabricated elements is customized. The probe card assembly is then built using the selected and customized elements.

24 Claims, 10 Drawing Sheets

U.S. PATENT DOCUMENTS

| | | |
|---|---|---|
| 5,828,226 A | 10/1998 | Higgins et al. |
| 5,974,662 A | 11/1999 | Eldridge et al. |
| 6,014,032 A | 1/2000 | Maddix et al. |
| 6,043,563 A | 3/2000 | Eldridge et al. |
| 6,047,469 A | 4/2000 | Lunn |
| 6,050,829 A | 4/2000 | Eldridge et al. |
| 6,133,744 A | 10/2000 | Yojima et al. |
| 6,160,412 A | 12/2000 | Martel et al. |
| 6,174,744 B1 | 1/2001 | Watanabe et al. |
| 6,184,576 B1 | 2/2001 | Jones et al. |
| 6,188,231 B1 | 2/2001 | Palagonia |
| 6,215,320 B1 * | 4/2001 | Parrish ................. 324/754 |
| 6,215,321 B1 * | 4/2001 | Nakata ................. 324/754 |
| 6,289,583 B1 | 9/2001 | Belmont et al. |

* cited by examiner

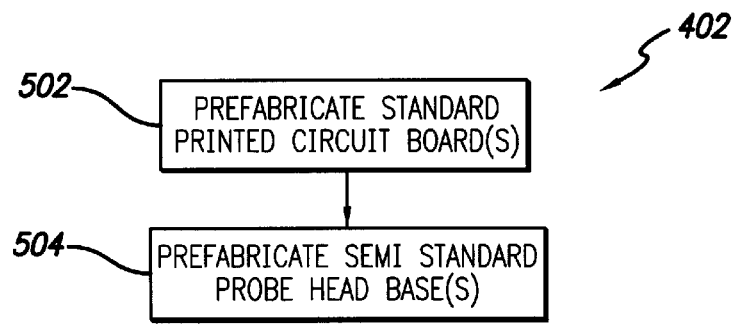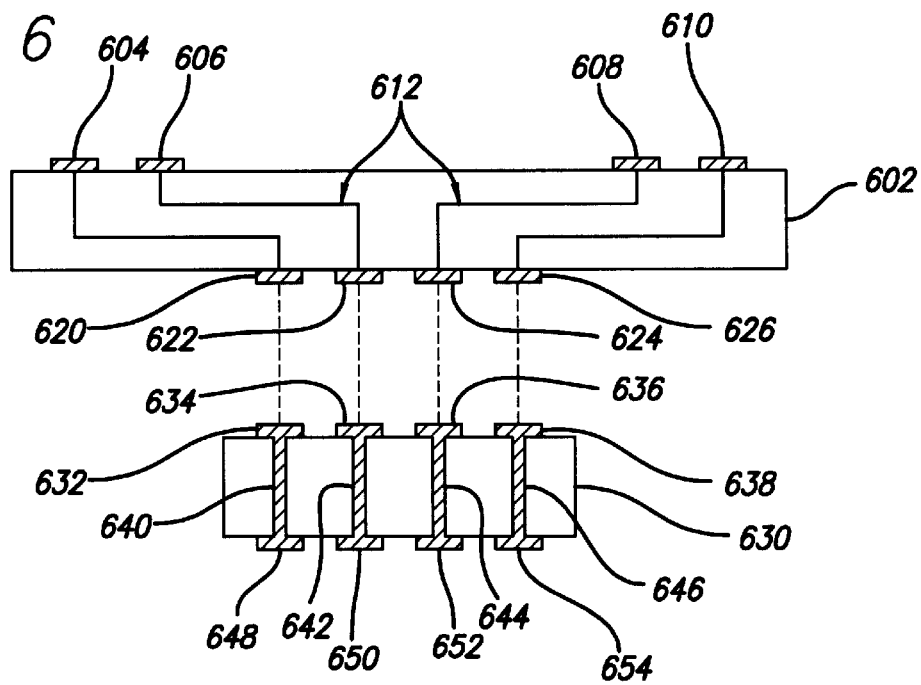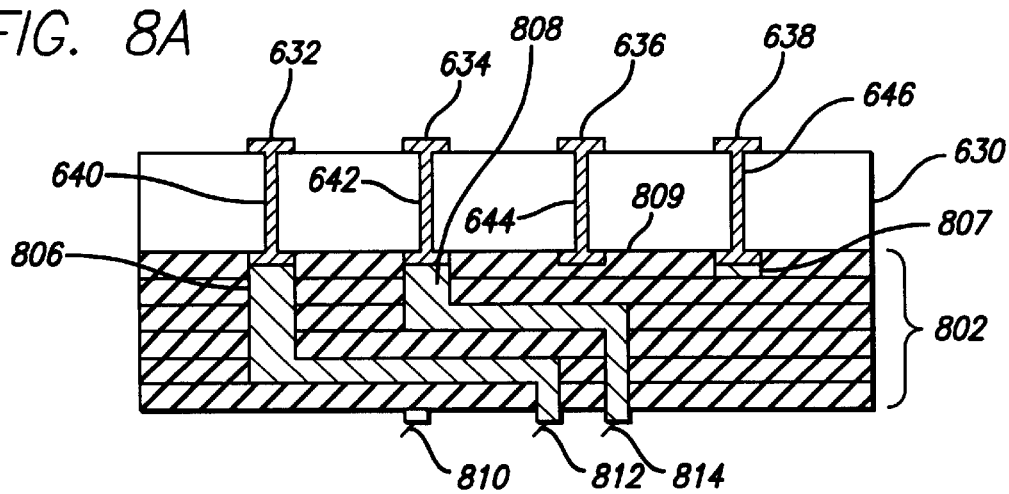

METHOD OF MANUFACTURING A PROBE CARD

BACKGROUND OF THE INVENTION

1. Field of the Invention

The present invention relates generally to an improved method of designing and manufacturing a probe card assembly and more specifically to use of prefabricated elements to speed design and manufacture of the probe card assembly.

2. General Background and Related Art

FIG. 1 illustrates a simplified overview of a typical flow of common activities involved in designing and manufacturing a semiconductor device, such as a microelectronic "chip." Initially, the semiconductor device is designed 10, and a tester and testing algorithms are selected and/or designed 12 for testing the semiconductor device. Using data regarding the semiconductor device design, the tester, and/or the test algorithms, a probe card for testing the semiconductor device is then custom designed 14. Usually concurrently, preparations are made to begin manufacturing the semiconductor device in commercial quantities 16. Once the probe card is designed and manufactured and preparations to manufacture the semiconductor device are completed, semiconductor devices are manufactured in commercial quantities 18. As the semiconductor devices are manufactured, each is tested 20, and good semiconductor devices are shipped to customers 22.

FIG. 2 illustrates a simplified block diagram of a typical test arrangement for testing the semiconductor device at step 20. A tester 120 generates test signals to be input into a semiconductor device under test 160. The tester 120 then monitors response signals generated by the semiconductor device under test 160. The tester 120 communicates with the semiconductor device under test 160 via a probe card assembly 100.

As shown in FIG. 2 and FIG. 3 (which illustrates a cross-section of the probe card assembly 100), a typical probe card assembly 100 includes a printed circuit board 102, which usually includes a number of tester contacts 130 for connecting to the semiconductor tester 120 (not shown in FIG. 3) via connections 122 (not shown in FIG. 3). A probe head 106 is attached to the printed circuit board 102. The probe head 106 includes probes 108 for contacting test points 162 on the semiconductor devices being tested 160.

As shown in FIG. 3, electrical traces 150 on or within the printed circuit board 102 connect the tester contacts 130 to the probe head assembly 106 and ultimately to probes 108. Thus, electrical paths between inputs and outputs (not shown) on the semiconductor tester 120, on one hand, and the probes 108, on the other hand, are established. As also shown in FIG. 3, the probe head 106 is typically connected to the printed circuit board 102 via connections 152, which may be, for example, solder ball connections or contact pins soldered to the printed circuit board 102, the probe head 156, or both. Traces 150 on or within the printed circuit board 102 connect the tester contacts 130 to the connections 152, and traces 154 on or within the probe head 106 connect the connections 152 to the probes 108.

Thus, in essence, the probe card assembly 100 acts as an interface, providing numerous electrical paths for test and response signals between the tester 120 and the device under test 160. As is known, a probe card assembly 100 must be custom designed to meet the specific test needs of the device under test 160 and the test specifications of the tester 120. For example, the probes 108 of the probe card assembly 100 must be custom positioned to match the pattern of test contacts 162 on the device under test 160, and the probe card assembly 100 must be custom designed such that each probe 108 is electrically connected through tester contacts 130 to the proper tester connection 122. For this reason, as shown in FIG. 1, the design and manufacture of the probe card assembly 14 does not begin until the semiconductor device has been designed 10 and a tester and/or testing algorithms selected 12.

As is known, semiconductor devices cannot be shipped to customers 22 until they are tested 20, and the probe card assembly is a necessary element of the test system. Thus, even if the step of preparing to manufacture the semiconductor devices 16 has been completed, manufacture, testing, and shipping of the semiconductor devices 18, 20, 22 cannot proceed until design and manufacture of the probe card 14 has been completed. Thus, if the design and manufacture of the probe card 14 takes longer than the preparations to manufacture the semiconductor devices 16, which is increasingly the case, the extra time taken in designing and manufacturing the probe card lengthens the entire process shown in FIG. 1 and delays the final step of shipping semiconductor devices to customers 22. Thus, a way of shortening the step of designing and manufacturing a probe card assembly is needed.

SUMMARY

The invention relates generally to methods of making probe card assemblies, which are used to test semiconductor devices. One or more elements of the probe card assembly is prefabricated to one or more predefined designs. Thereafter, design data regarding a newly designed semiconductor device is received along with data describing the tester and testing algorithms to be used to test the semiconductor device. Using the received data, one or more of the prefabricated elements is selected. Again using the received data, one or more of the selected prefabricated elements is customized. The probe card assembly is then built using the selected and customized elements. The use of prefabricated elements shortens the process of designing and manufacturing a probe card assembly.

BRIEF DESCRIPTION OF THE DRAWINGS

FIG. 5 illustrates exemplary steps for performing step 402 of FIG. 4.

FIG. 6 illustrates an exemplary prefabricated printed circuit board and probe head base.

FIG. 8A illustrates an exemplary manner of adding customization to a probe head base.

DETAILED DESCRIPTION

The present invention is directed to an improved method of designing and manufacturing a probe card assembly. The following specification describes several exemplary embodiments and applications of the invention. The invention, however, is not limited to these exemplary embodiments and applications or to the manner in which the exemplary embodiments and applications operate or are described herein.

Figure 1:
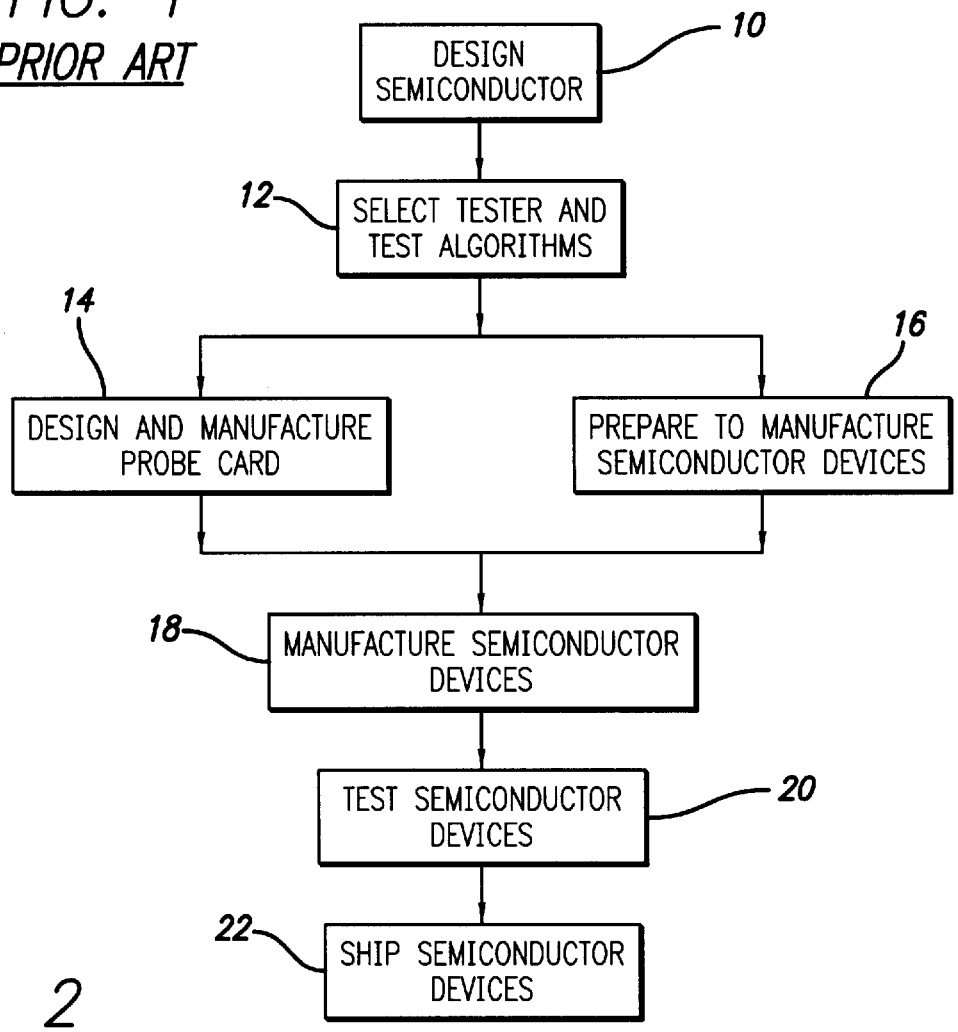
FIG. 1 illustrates an overview of a typical flow of common activities involved in designing and manufacturing a semiconductor device.
Figure 2:
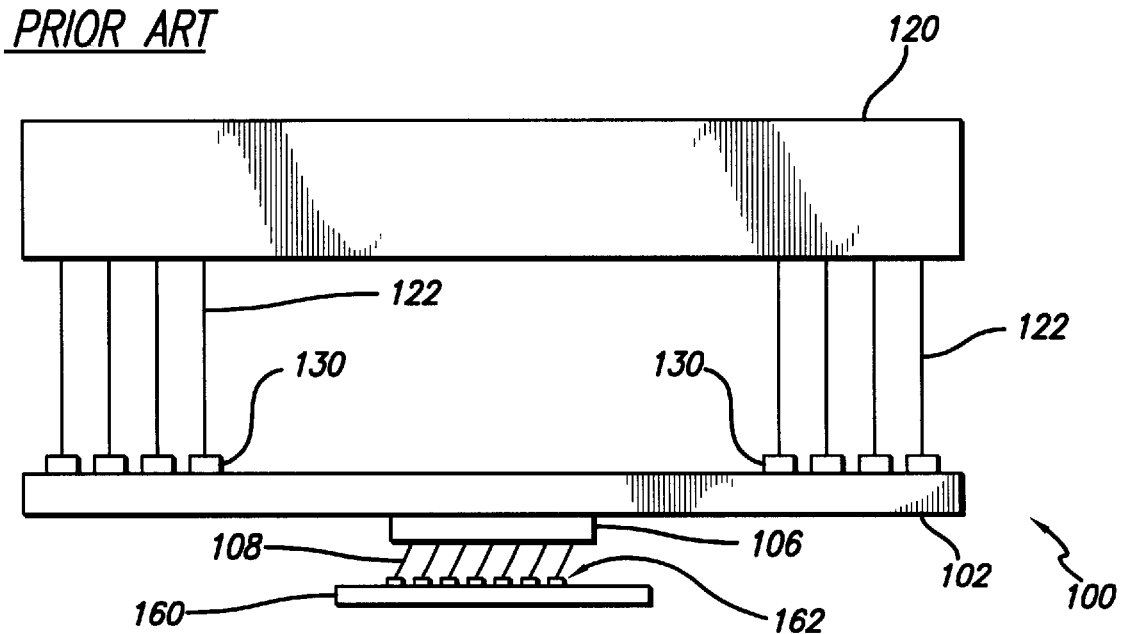
FIG. 2 illustrates a simplified block diagram of a typical testing system used to test semiconductor devices.
Figure 3:
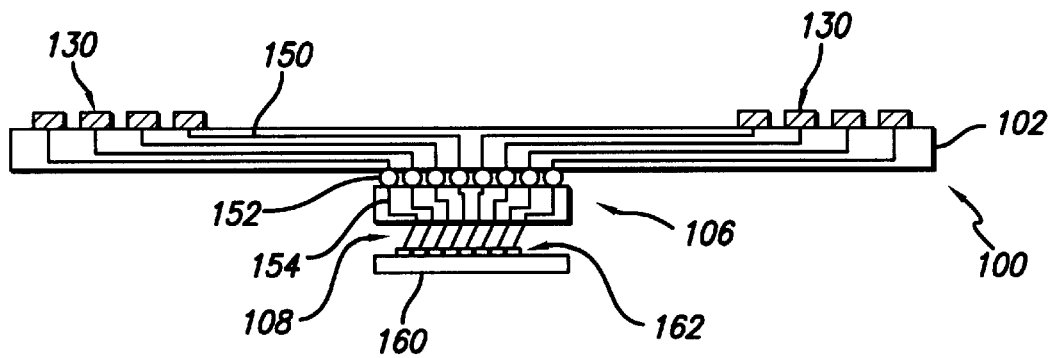
FIG. 3 illustrates a cross section of a typical probe card assembly and a semiconductor device under test.
Figure 4:
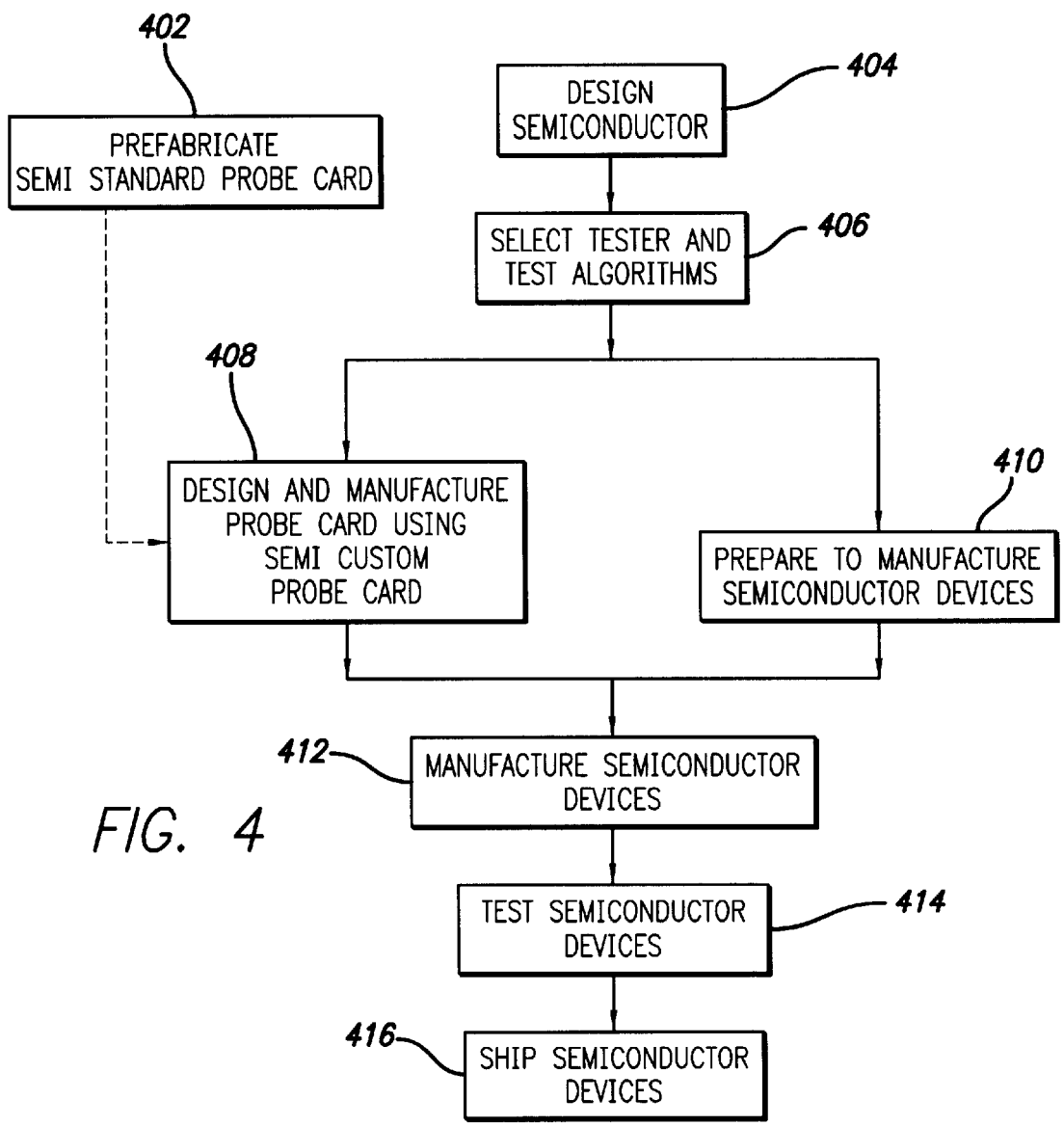
FIG. 4 illustrates an exemplary embodiment of the present invention.

FIG. 4 illustrates an exemplary application of the principles of the present invention to a process for designing, manufacturing, and shipping a semiconductor device. As shown, an initial step is designing a new semiconductor device 404, such as a microelectronic "chip." A tester and/or testing algorithms for testing the semiconductor device must also be selected and/or designed 406. Separate and apart from these two steps, and preferably prior to these steps, semistandard probe card assemblies are premanufactured 402. Once the semiconductor design 404 is complete and the tester and/or testing algorithms have been selected 406, data regarding the semiconductor design and the tester and/or testing algorithm are used to add customization to the prefabricated semistandard probe card assembly at step 408. Use of a premanufactured, semistandard probe card assembly simplifies and shortens the process of designing and manufacturing the probe card assembly 408. Because the step of designing and manufacturing the probe card assembly 408 is a critical step in the overall process illustrated in FIG. 4, shortening this step may shorten the overall process of FIG. 4.

Figure 7:
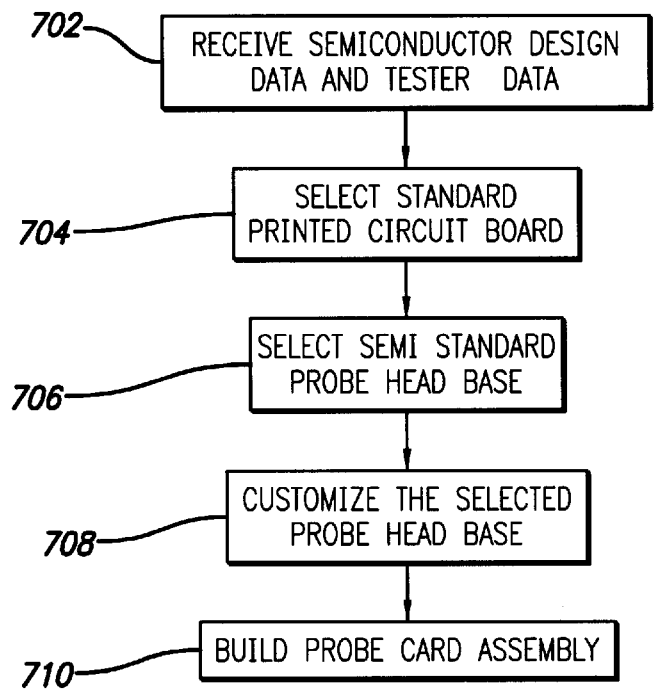
FIG. 7 illustrates exemplary steps for performing step 408 of FIG. 4.

There are many ways to prefabricate semistandard probe card assemblies 402 for later customization 408 to a specific semiconductor device design and tester and/or testing algorithm. FIG. 5 illustrates an exemplary embodiment of the step of prefabricating semistandard probe card assemblies 402, and FIG. 7 illustrates an exemplary embodiment of the step of designing and manufacturing a probe card assembly using a semistandard probe card assembly 408.

At step 502 in FIG. 5, standard printed circuit boards are premanufactured to one or more standard designs. The designs are "standard" in the sense that they are not driven by any specific semiconductor design or test algorithm. The printed circuit boards are "premanufactured" in the sense that they may be, and preferably are, designed and manufactured prior to completion of the semiconductor design step 404 and step of selecting a tester and/or testing algorithm 406 of FIG. 4. Of course, however, the standard designs may correspond generally with common semiconductor designs or design methodologies as well as common tester configurations and test algorithms or methodologies.

The present invention is not dependent on the use of any particular type of printed circuit board. Shown in FIG. 6 is a cross section view of an exemplary printed circuit board 602 that may be used with the invention. As can be seen, printed circuit board 602 includes tester contacts 604, 606, 608, 610 for making electrical connections with a tester (not shown in FIG. 6). Printed circuit board 602 may be generally circular in shape and have numerous tester contacts; only four tester contacts 604, 606, 608, 610 are shown for simplicity. Electrical connections 612 connect tester contacts 604, 606, 608, 610 to contacts 620, 622, 624, and 626. It should be understood that connections 612 are illustrated schematically and may take any of many physical forms. For example, conductive traces located on the top side (from the perspective of FIG. 6) or within the printed circuit board 602 may connect tester contacts 604, 606, 608, 610 to vias (not shown) that extend through the printed circuit board to contacts 620, 622, 624, 626. Alternatively, printed circuit board 602 may include a hole or cavity (into which the probe head 630 may fit), and contacts 620, 622, 624, 626 may be located within the hole or cavity. Another nonexclusive example of a printed circuit board that may be used is described in copending U.S. patent application Ser. No. 09/060,308, filed Apr. 14, 1998, which is incorporated herein in its entirety by reference. It should be noted that the printed circuit board may be made out of any material or combination of materials suitable for creating a platform for supporting tester contacts 604, 606, 608, 610 and contacts 620, 622, 624, 626 with electrical connections there between.

There is no limit to the criteria that may be used to establish the standard designs for the printed circuit board. Referring again to FIG. 6, one nonexclusive example of a criterion is the pattern of the tester contacts 604, 606, 608, 610. That is, printed circuit boards 602 may be premanufactured to have particular patterns of tester contacts 604, 606, 608, 610, which may, for example, be readily capable of interfacing with known testers (not shown in FIG. 6). Another nonexclusive example of a criterion for establishing a standard design is the pattern of contacts 620, 622, 624, 626, which may interface with a probe head 630. Again, the printed circuit boards 602 may be premanufactured to have any one of a number of predetermined patterns of contacts 620, 622, 624, 626. Yet another nonexclusive example of a standard design criterion is a pattern of wiring 612 connecting tester contacts 604, 606, 608, 610 to contacts 620, 622, 624, 626. Again, the printed circuit boards 602 may be premanufactured to have any one of a number of predetermined patterns of such wiring 612. More simply, the printed circuit boards 602 may be premanufactured to one of several predetermined sizes. Of course, the standard designs may be based on any combination of the above mentioned exemplary criteria, or any other suitable criteria.

Referring back to FIG. 5, at step 504, semistandard probe head bases are premanufactured to one or more predetermined, semistandard designs. The designs are "semistandard" in the sense that their initial design and manufacture are not driven by any particular semiconductor device design or test algorithm. They are, however, designed to be later customized to a particular semiconductor device design, tester, and/or test algorithm. The probe head bases are "premanufactured" in the sense that, initially, they may be, and preferably are, designed and manufactured prior to completion of the semiconductor device design step 404 and step of selecting a tester and/or testing algorithm 406 of FIG.

4. Of course, however, the semistandard designs may correspond generally with common semiconductor device designs or design methodologies as well as common tester configurations and test algorithms or methodologies.

The present invention is not dependent on the use of any particular type of probe head. Shown in FIG. 6 is a cross section of an exemplary probe head base 630 that may be used with the invention. In the exemplary probe head base 630 illustrated in FIG. 6, probe head base 630 includes contacts 632, 634, 636, 638 for making electrical connections to contacts 620, 622, 624, 626 on printed circuit board 602. Vias 640, 642, 644, 646 provide electrical connections through the probe head base 630 to contacts 648, 650, 652, 654. These vias form wiring paths, or in other words a wiring pattern. As discussed below, a customized pattern of probes (not shown) and customized interconnections between contacts 648, 650, 652, 654 may be added to the bottom surface (from the perspective of FIG. 6) of the probe head base 630.

The exemplary probe head base 630 illustrated in FIG. 6 is preferably made of a solid or layered ceramic material. It should be noted, however, that the probe head base may be made out of any material or combination of materials suitable for creating a platform for supporting contacts 632, 634, 636, 638 and contacts 648, 650, 652, 654 with electrical connections there between. It should also be noted that the vias 640, 642, 644, 646 may be fashioned or replaced with other connectors that allow the contacts on one surface of probe head base 630 to be disposed in a pattern that is different than the contacts on the other surface. One nonexclusive alternative silicon based probe head that may be used with the present invention is disclosed in U.S. patent application Ser. No. 09/042,606, filed Mar. 16, 1998, which is incorporated herein by reference in its entirety.

As with the printed circuit board, there is no limit to the criteria establishing the predetermined, semistandard designs. Referring again to FIG. 6, one nonexclusive example of a criterion is the pattern of the contacts 632, 634, 636, 638 for contacting the printed circuit board 602. That is, probe head bases 606 may be premanufactured to have particular patterns of such contacts, which may, for example, be designed to match a pattern of contacts 620, 622, 624, 626 on one of the premanufactured printed circuit boards 602, as shown in FIG. 6. Another nonexclusive example of a criterion establishing an initial design of the probe head bases is the pattern of contacts 648, 650, 652, 654 that will connect to probes (not shown in FIG. 6). Again, the probe head bases 630 may be premanufactured to have any one of a number of predetermined patterns of such contacts. Yet another nonexclusive example of a standard design criterion is a pattern of vias or wiring 640, 642, 644, 646 connecting the contacts on one side of the probe head bases 630 to the contacts on the other side. The probe head bases 630 may be premanufactured to have any one of a number of predetermined patterns of such vias or wiring. As with the printed circuit board 602, the probe head bases 630 may be premanufactured to one of several predetermined sizes. Of course, however the semistandard designs may be based on any combination of the above mentioned exemplary criteria, or any other suitable criteria.

Referring now to FIG. 7 (which illustrates an exemplary process for carrying out step 408 of FIG. 8), data regarding the design of the specific semiconductor device to be tested is received as is data regarding the tester and test algorithms to be used 702. The data may include (without limitation) such things as the locations of test points on the semiconductor device, information regarding test signals to be input into selected ones of the test points, information regarding responses expected at ones of the test points, and/or other information regarding testing of the semiconductor device. Using the semiconductor device design data, tester, and/or test algorithm data received at step 702, a prefabricated, standard printed circuit board and a semistandard probe head base are selected 704, 706. Again using the semiconductor device design data, tester, and/or test algorithm data received at step 702, the selected probe head base is customized to meet the specific test needs of the semiconductor device design, the tester, and/or the test algorithm 708. The probe card assembly is then assembled by, among other things, bringing the customized probe head base together with the selected printed circuit board 710. It should be noted that all of the steps illustrated in FIG. 7 and described above need not necessarily be performed in the order shown. For example, the probe head base and the standard printed circuit board may be brought together before the probe head base is customized, and thereafter, the probe head bas is customized.

FIG. 8A illustrates an exemplary manner in which a probe head base may be customized. The probe head base 630 illustrated in FIG. 8A is similar to the probe head base 630 discussed above with respect to FIG. 6. It is preferably made of a nonconductive material, such as ceramic, with a plurality of vias 640, 642, 644, 646 (to simplify the discussion only four are shown) that electrically connect a pattern of contacts 632, 634, 636, 638 (again only four are shown to simplify the discussion) on one side of the probe head base 630 to a pattern of similar contacts (only four shown) on the other side 809 of the probe head base 830.

In the example illustrated in FIG. 8A, customization is added to side 809 of the probe head 630 in the form of patterned layers of a conductive material and an insulating material 802. A custom pattern of probes 810, 812, 814 (only three are shown for simplicity) are formed on the outermost layer. This pattern of probes is customized to match a pattern of test contacts on the semiconductor device to be tested (not shown in FIG. 8A). The customization layers 802 define conductive paths that form signal paths from a via 640, 642, 644, 646 to a probe 810, 812, 814. (It should be noted that the size of the customization layers with respect to the probe base is not necessarily to scale.) In the specific example shown in FIG. 8A, conductive path 806 connects via 640 to probe 812. Similarly, conductive path 808 connects via 642 to probe 814. Conductive path 807, which initially extends vertically from via 646 but then turns into the page so as not be seen in the view shown in FIG. 8A, connects via 646 with probe 810. (Note that via 810 is located into the page with respect to vias 812, 814.) Via 644 is not used and therefore is not connected to a probe. In this manner, custom positioned probes 810, 812, 814 are added to the probe head base 630 to correspond to specific test points on the semiconductor devices to be tested, and custom layers 802 provide custom wiring paths from vias 640, 642, 644, 646 to the probes.

It should be noted that any type of probe suitable for contacting test points on a semiconductor device under test may be used with the present invention. Typically, a probe will include a contact pad formed on or within an outer layer of the customization layers 802, and an elongate, conductive structure formed on the contact pad. Examples of an elongate, conductive structure include, but are not limited to, needle probes and cobra-style probes. Another example of an elongate, conductive structure that may be used are resilient spring-like structures. Examples of such structures are described in U.S. Pat. Nos. 5,476,211, 5,917,707, and 6,184,053 B1, each of which is incorporated herein by reference in its entirety. Of course, the probes may be nothing more than simple contact pads, which may be particularly useful if the test points on the semiconductor are bumps, elongate spring-like connectors, or other raised or extended test points. Other suitable "probes" that may be particularly useful with raised or extended test points on the semiconductor device include conductive recesses or sockets formed in outer layers of the customization layers 802. The term "probes," as used herein, is intended to include all of the foregoing structures and similar structures.

The exemplary customization layers 802 illustrated in FIG. 8A may be formed layer-by-layer on the probe head base 630 using standard lithographic techniques well understood in the semiconductor field, including laser patterning techniques. Alternatively, the customization layers 802 may be formed separately from the probe head base 630 and then joined to the probe head base. Of course, the customization layers 802 may also be formed using a combination of the foregoing. It is also within the scope of the invention that the customization layers 802 may be formed from one or more prefabricated semicustom layers that are selected and joined to form the customization layers 802.

Figure 8B:
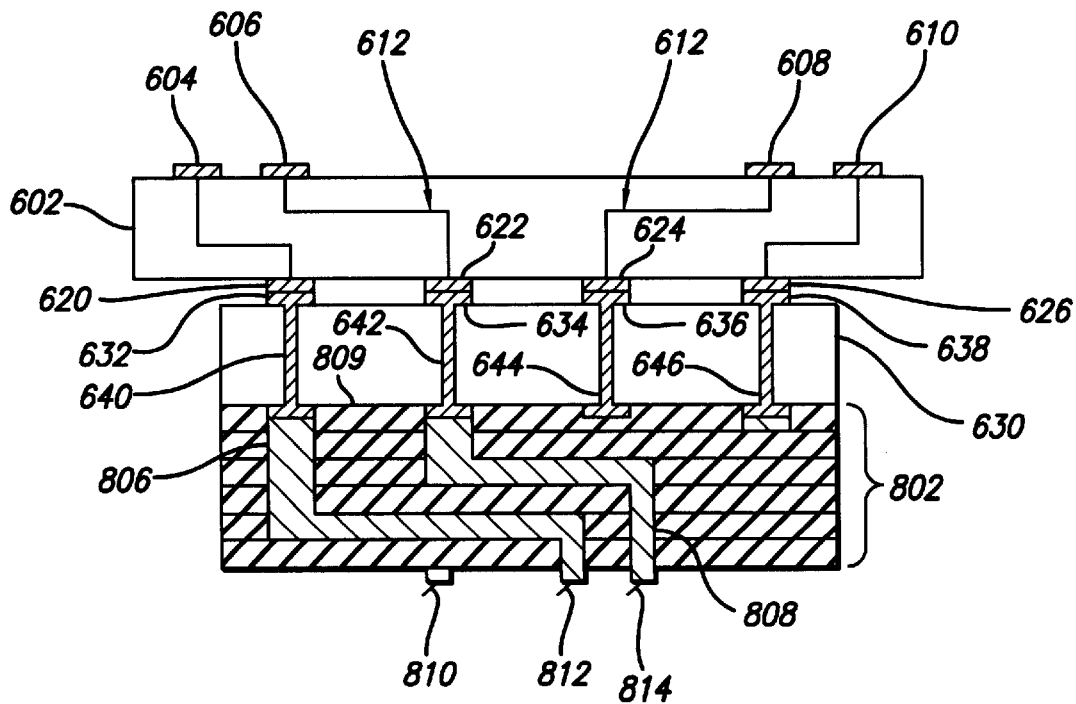
FIG. 8B illustrates a customized probe head base joined to a printed circuit board.

Once the probe head base 630 has been customized, it is joined to the selected printed circuit board 602 as shown in FIG. 8B. As should be apparent, a custom pattern of probes 810, 812, 814 (three shown of many) has been formed, and tester contacts 604, 606, 608, 610 (four shown of many) have been custom connected to the probes. In the example shown in FIG. 8B, tester contact 604 has been connected to probe 812; tester contact 606 has been connected to probe 814; tester contact 608 is not used and has not been connected to a probe; and tester contact 610 has been connected to probe 810.

Figure 9A:
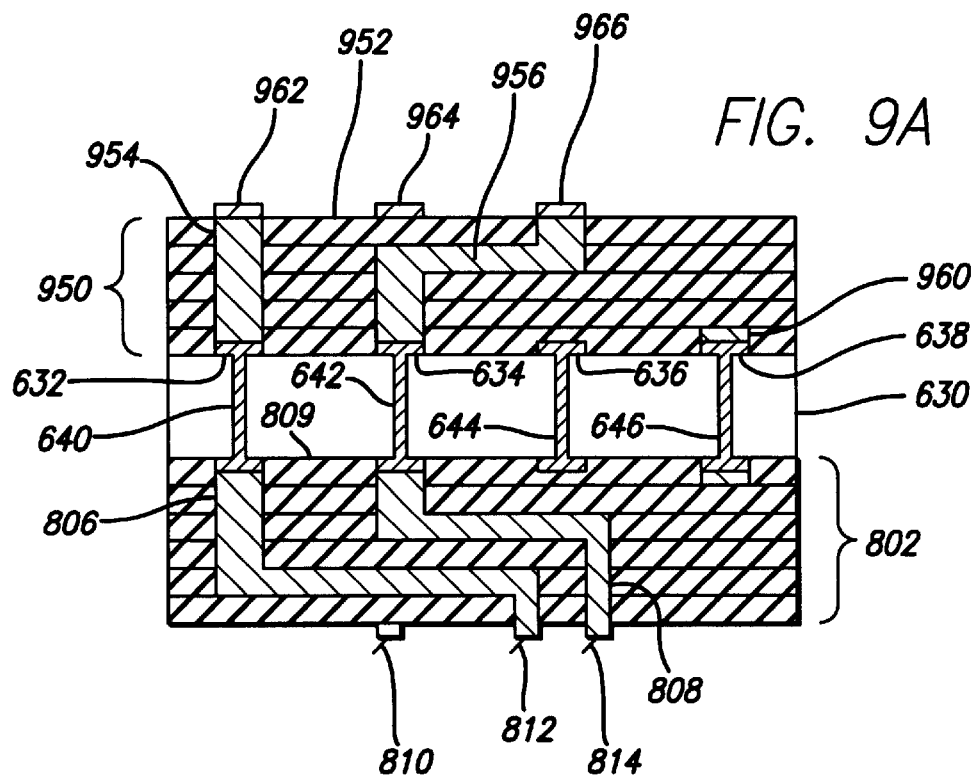
FIG. 9A illustrates customization applied to both sides of a probe head base.
Figure 9B:
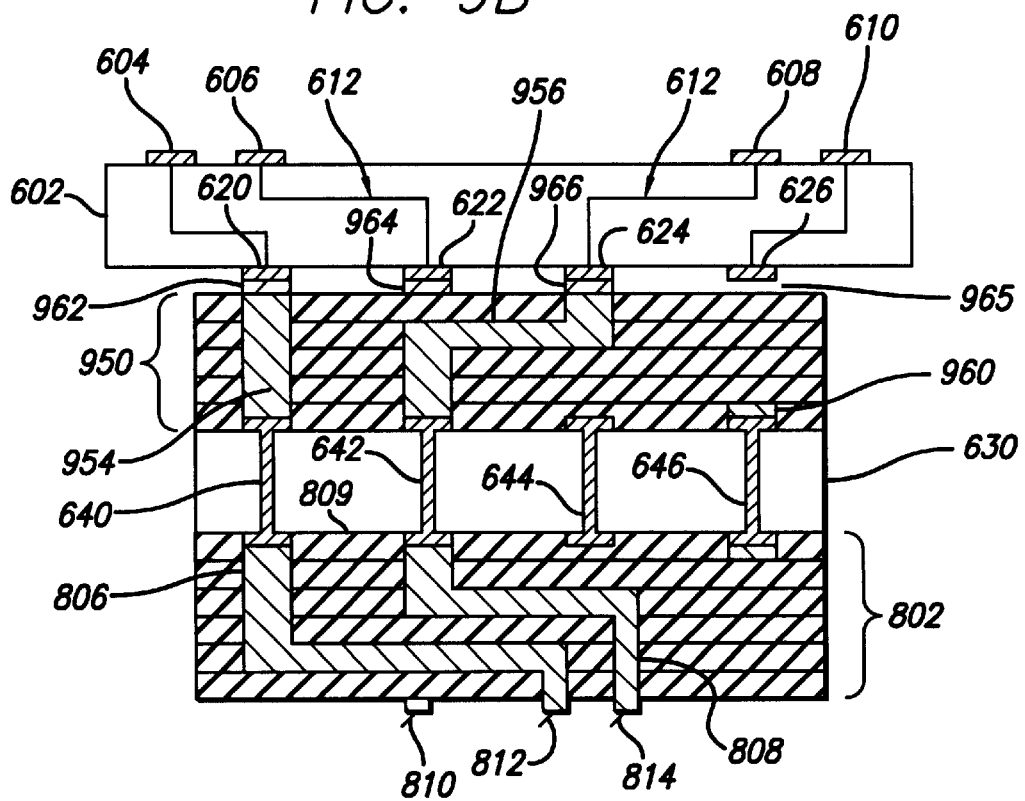
FIG. 9B illustrates a customized probe head base joined to a printed circuit board.

As shown in FIGS. 9A and 9B, customization may be formed on both sides of the probe head base 630. As shown, the connections between vias 640, 642, 644, 646 and corresponding contact pads on printed circuit board 602 are altered or customized from the standard configuration by customization layers 950. Namely, although contact pad 620 on printed circuit board 602 remains connected to via 640 through conductive path 954, contact 622 on printed circuit board 602 is now connected to via 646 through conductive path 960 (much of which extends into the page in the views shown in FIGS. 9A and 9B), and contact 624 is connected to via 642 through conductive path 956. In this example, contact 626 and via 644 are not used, and therefore are not connected.

Although in the exemplary processes illustrated in FIGS. 5 through 9B customization is applied only to the probe head while the printed circuit board is fully standard, customization may alternatively or additionally be applied to the printed circuit board. For example, some or all of the exemplary customization layers 950 illustrated in FIGS. 9A and 9B could be applied to the lower surface (from the perspective of FIGS. 9A and 9B) of the printed circuit board. Likewise, customization layers (not shown) could be applied to the upper surface of the printed circuit board 602 on which are located tester contacts 604, 606, 608, 610 in order to customize the connections between the tester (not shown) and the printed circuit board. Indeed, it is within the scope of the invention to prefabricate in one or more fully standard or semistandard configurations any one or more of the surfaces of the printed circuit board 602 and the probe head base 630, and later customize the semistandard surfaces.

Figure 10A:
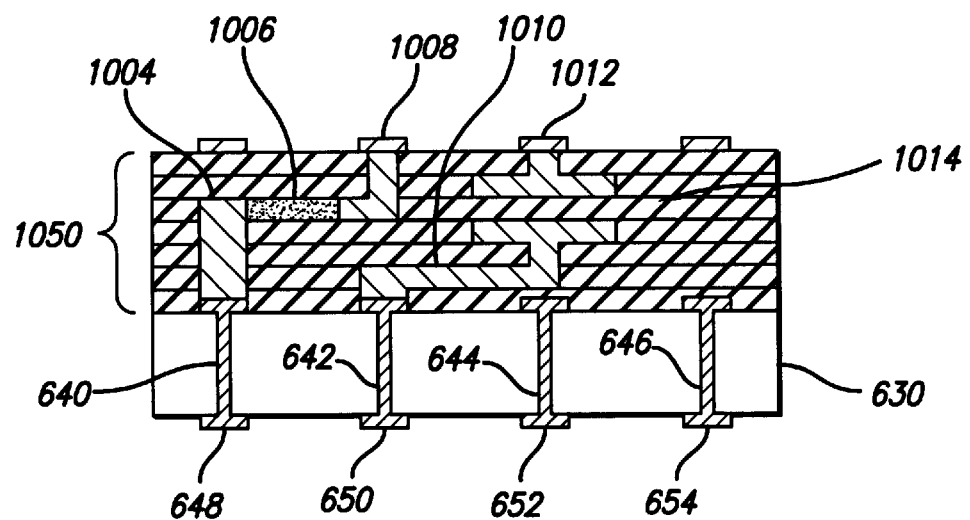
FIG. 10A illustrates forming circuit elements within customization layers.

Circuit elements may be optionally formed within the customization layers discussed above. FIG. 10A illustrates an exemplary resistor 1006 and an exemplary capacitor 1014 formed within customization layers 1050. In the example shown in FIG. 10A, and in accordance with the above discussion with regard to FIGS. 8A through 9B, a conductive path 1004 is formed between via 640 in probe head base 630 and terminal 1008. Resistive material 1006 embedded within the conductive path 1004 adds a resistor to the path. The resistive material 1006 may be formed within customization layers 1050 using standard lithographic techniques known to those in the semiconductor field, including laser patterning techniques. A similar conductive path 1010 is formed between via 642 and terminal 1012. As shown in FIG. 10A, a capacitor 1014 is formed along the conductive path 1010. In like manner, any number and type of circuit elements may be embedded within customization layers 1050. Indeed, it is within the scope of the invention to form a microelectronic circuit, such as an integrated circuit, within the customization layers using standard lithographic techniques used to make semiconductor devices, including laser patterning techniques. Thus, circuit elements such as microprocessors, memories, and the like can also be built into the customization layers 1050.

Figure 10B:
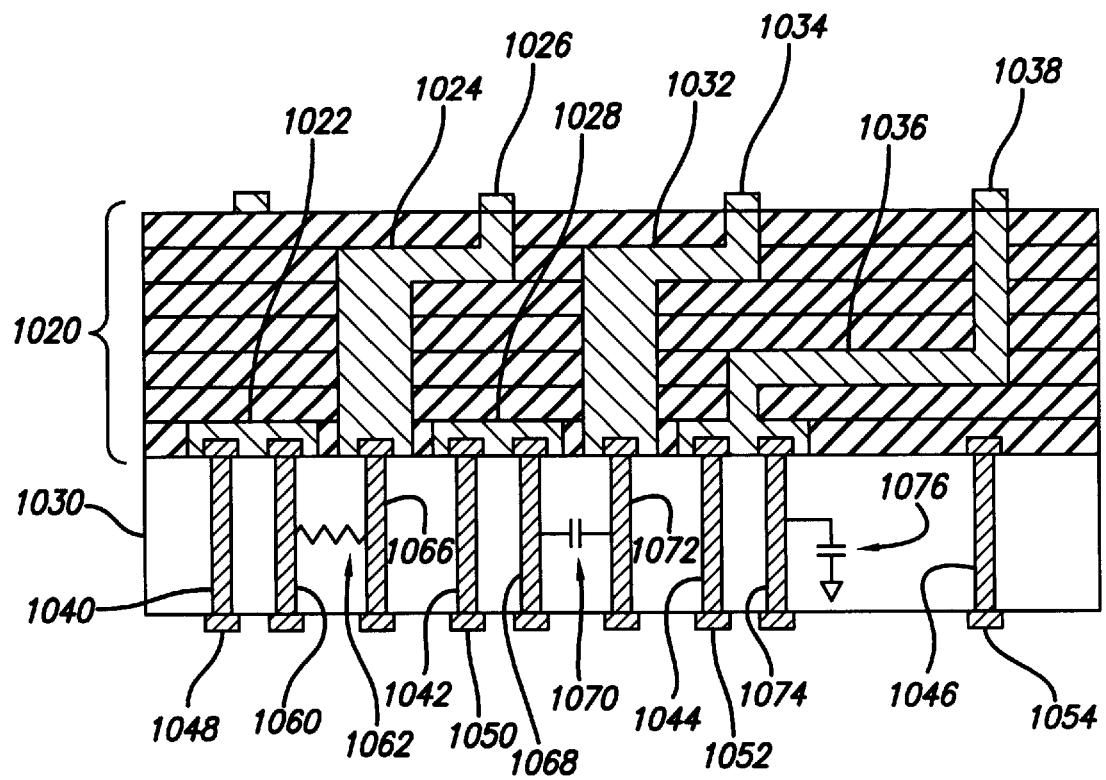
FIG. 10B illustrates selectively adding circuit elements to the customization portion.

FIG. 10B illustrates an alternative way of incorporating select circuit elements into the customization. Like probe head base 630, exemplary probe head base 1030 includes vias 1040, 1042, 1044, 1046 that provide conductive paths from one side of the probe head base 1030 to the other. Unlike probe head base 630, however, probe head base 1030 includes embedded circuit elements. As shown in this example, probe head base 1030 includes an embedded resistor 1062, capacitor 1070, and capacitor 1076. Vias 1060, 1066, 1068, 1072, 1074 provide signal paths to the embedded circuit elements. Custom layers 1020 selectively include the embedded circuit elements. In the example shown in FIG. 10B, resistor 1062 has been included in custom conductive path 1022, 1024 between via 1040 and contact 1026; series capacitor 1070 has been included in custom conductive path 1028, 1032 between via 1042 and contact 1034; and grounded capacitor 1076 has been included in custom conductive path 1036 between via 1044 and contact 1038.

Figure 11A:
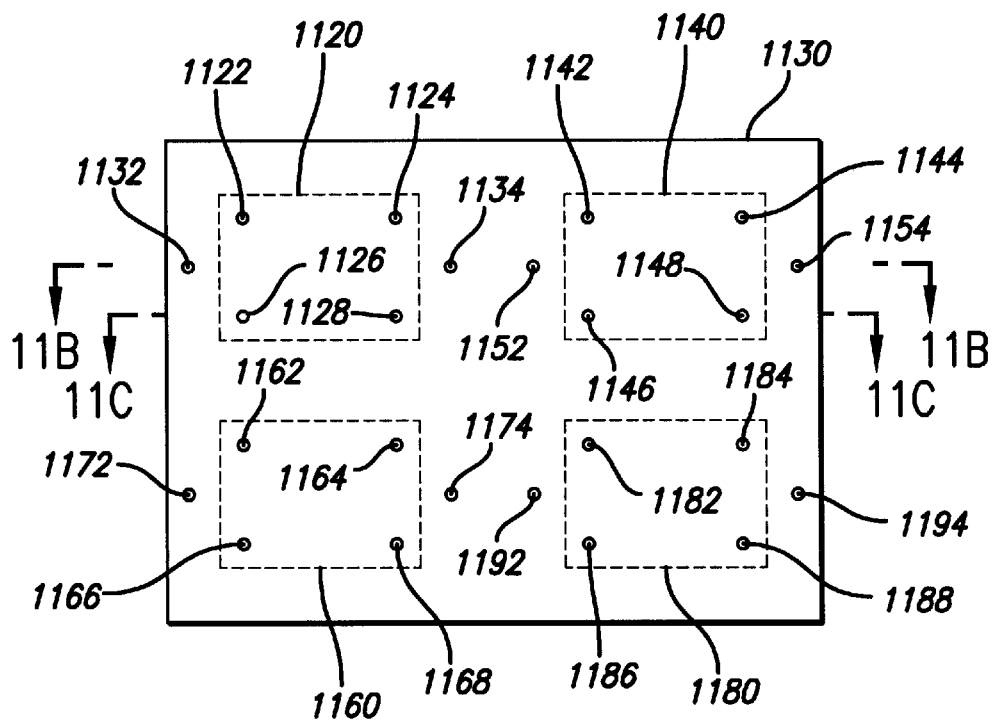
FIGS. 11A, 11B, and 11C illustrate an exemplary probe head base with embedded decoupling planelets.
Figure 11B:
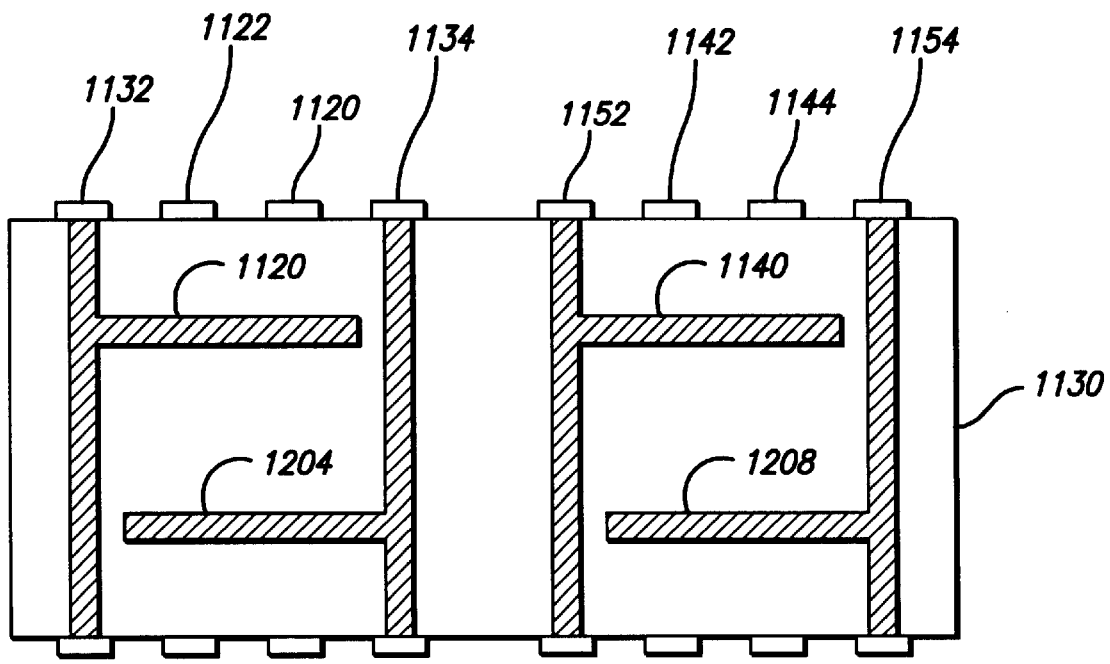
Figure 11C:
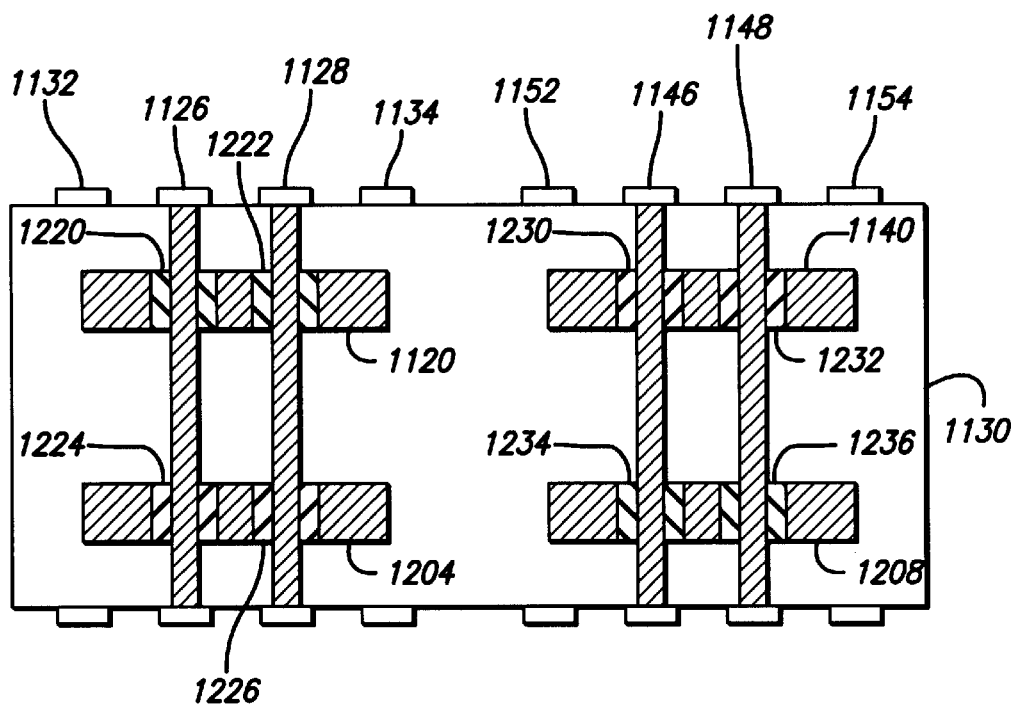
Figure 12:
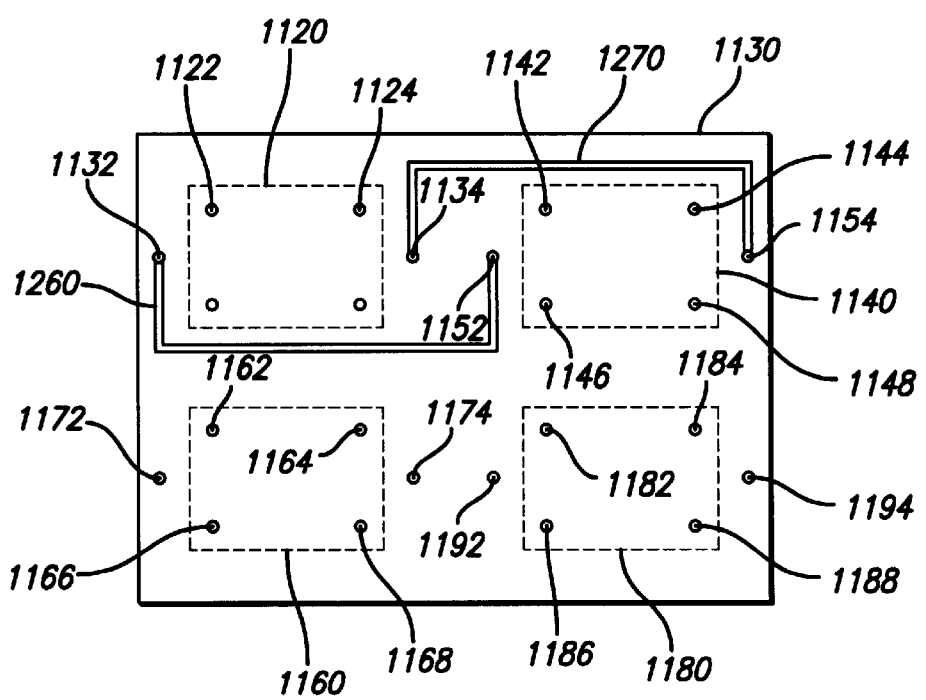
FIG. 12 illustrates selective connection of the planelets in FIGS. 11A, 11B, 11C to form larger decoupling planes.

FIGS. 11A through 12 illustrate a way of including customized decoupling capacitance in a probe card assembly. As shown in FIG. 11A, an exemplary probe head base 1130 includes a number of embedded parallel power and ground planelets for decoupling the power supply (not shown). As discussed below, the planelets can be selectively connected to form larger decoupling planes.

FIG. 11A illustrates a top view of an exemplary semistandard probe head 1130 with embedded power and ground planelets. In this example (and as illustrated in FIGS. 11B and 11C), the power planelets 1120, 1140, 1160, and 1180 and the ground planelets 1204, 1208 (only two are shown) are embedded within the probe head 1130, and the power planelets are located above the ground planelets from the perspective of FIG. 11A. For these reasons, only the power planelets 1120, 1140, 1160, 1180 are shown in FIG. 11A, and they are shown as dashed lines (indicating that they are embedded).

A number of signal vias (in this example four) pass through each set of parallel power and ground planelets. (For example, signal vias 1122, 1124, 1126, 1128 pass through power plane 1120 and ground plane 1204.) FIG. 11C is a cross-section of the probe head 1130 taken through two of the four vias that pass through each of two parallel sets of power and ground planelets. As shown in FIG. 11C, signal vias 1126, 1128 provide signal paths from one side of probe head 1130 to the other, and in doing so, both signal vias pass through a parallel set of power and ground planelets 1120, 1204. Insulated hole 1220 in power planelet 1120 allows signal via 1126 to pass through power planelet 1120, while insulating the signal via 1126 from the power planelet 1120. Insulated hole 1224 in ground planelet 1204 similarly allows signal via 1126 to pass through ground planelet 1204, while insulating signal via 1126 from ground planelet 1204. Similar insulated holes 1222, 1226, 1230, 1132, 1234, 1236 allow signal vias 1128, 1146, 1148 to pass through power and ground planelets 1120, 1204, 1140, 1208.

Referring again to FIG. 11A, power vias 1132, 1152, 1172, 1192 provide an electrical connection to embedded power planelets 1120, 1140, 1160, 1180; and ground vias 1134, 1154, 1174, 1194 similarly provide electrical connections to corresponding embedded ground planes 1204, 1208 (only two are shown in FIGS. 11B and 11C). FIG. 11B is a cross section of probe head 1130 taken through power vias 1132, 1152 and ground vias 1134, 1154. As shown in FIG. 11B, power via 1132 provides an electrical connection to power planelet 1120, and ground via 1134 provides an electrical connection to ground planelet 1204. Similarly, power via 1152 and ground via 1154 provide electrical connections to power planelet 1140 and ground planelet 1208, respectively.

Each set of substantially parallel power and ground planelets provides a decoupling capacitance in parallel with the power supply (not shown) to the probe head. By selectively connecting adjacent power vias 1132, 1152, 1172, 1192 and adjacent ground vias 1134, 1154 1174, 1194, larger decoupling plane sets can be created. For example, as shown in FIG. 12, power vias 1132, 1152 are electrically connected by trace 1260, which effectively joins power planelets 1120, 1140. Similarly, trace 1270 electrically connects ground vias 1134, 1154, effectively joining ground planelets (not shown) corresponding to power planelets 1120, 1140. Traces 1260, 1270 may be formed in customization layers added to probe head 1130 in a manner similar to customization layers 802 in FIG. 8A, 950 in FIG. 9A, and 1050 in FIG. 10A. In this manner, a semistandard probe head base, such as 1130, may be prefabricated to include many sets of initially unconnected decoupling power and ground planelets. Thereafter, the sets of decoupling power and ground planelets may be selectively connected to form customize located and sized decoupling power and ground planes.

It should be noted that the sets of parallel power and ground planes illustrated in FIGS. 11A through 12 each include only one power plane and only one ground plane. The parallel sets may optionally include more than one power plane and/or more than one ground plane. One power plane and one ground plane are shown in FIGS. 11A to 12 to simplify the discussion.

Although the above described method of custom connecting coupling planelets has general applicability, it is particularly advantageous where multiple dice on a semiconductor wafer are being tested at the same time. By selectively connecting planelets as described above, one can create effective decoupling planes that generally correspond to each die being tested.

Figure 13A:
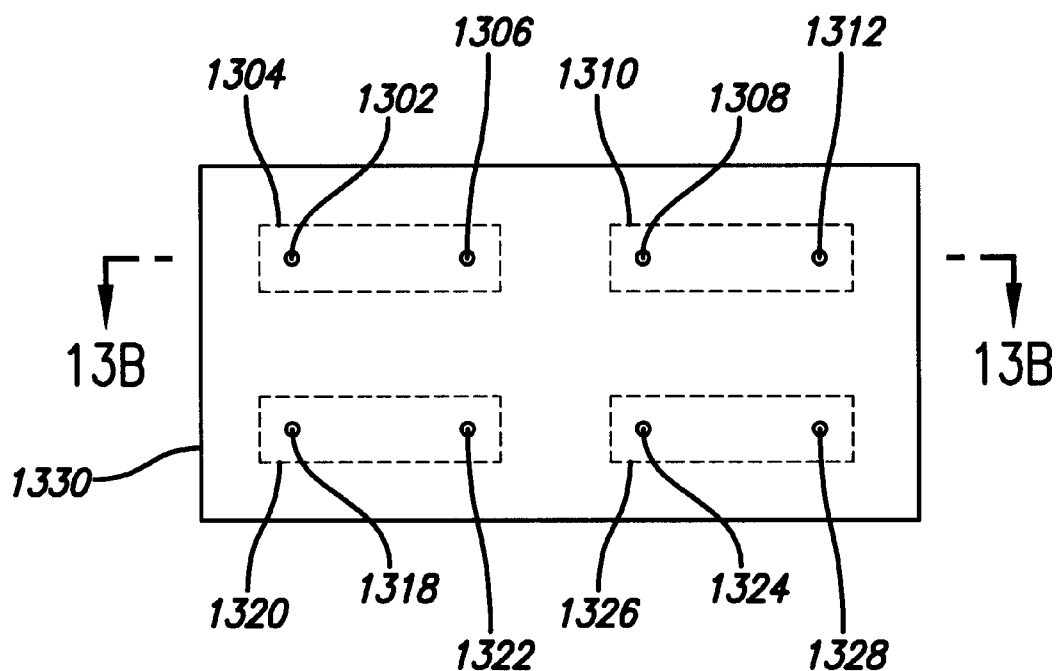
FIGS. 13A and 13B illustrate an exemplary probe head base with embedded impedance altering planelets.
Figure 13B:
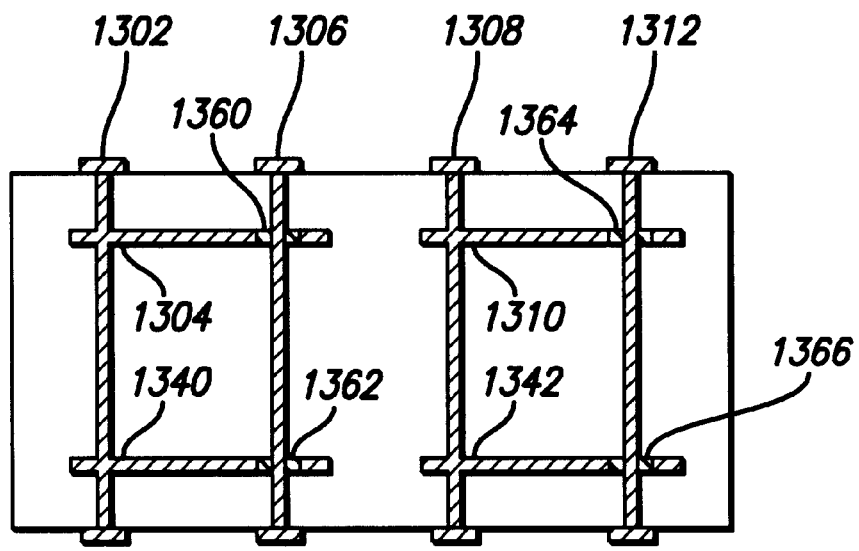

FIGS. 13A and 13B illustrate customizing the impedance of vias in a semistandard element, such as a probe head base. As shown in FIGS. 13A and 13B, an exemplary prefabricated, probe head base 1330 may include sets of substantially parallel embedded conductive planelets 1304, 1310, 1320, 1326 that surround signal vias 1306, 1312, 1322, 1328. FIG. 13A, being a top view, shows only the topmost planelet in each set 1304, 1310, 1320, 1326, and these are shown in dashed lines, indicating that they are embedded. As shown in FIG. 13B, which is a cross-section of FIG. 13A, each set of planelets includes two substantially parallel planlets. It should be noted, however, that the sets need not include two planelets; rather, each set may include as few as only one planlet each or may include more than two planlets each.

As shown in FIG. 13B, insulated holes 1360, 1362 allow signal via 1306 to pass through planelets 1304, 1340 without making electrical contact with the planelets. As also shown in FIG. 13B, insulated holes 1364, 1366 similarly allow signal via 1312 to pass through planelets 1310, 1342. Though not shown in FIG. 13B, similar insulated holes are provided in planelets 1320, 1326 for signal vias 1322, 1328. Planelet vias 1302, 1308, 1318, 1324 provide electrical access to the planelets 1304, 1310, 1320, 1326. This is best shown in FIG. 13B, which shows planelet via 1302 being electrically connected to a set of substantially parallel planelets 1304 and 1340, and planelet via 1308 being electrically connected to another set of substantially parallel planelets 1310, 1342. The impedance of a signal via can be manipulated by selectively connecting its associated planelet via to ground (ground connection not shown). For example, to alter the impedance of signal via 1312, its associated planelet via 1308 would be connected to ground. Any of the planelet vias 1302, 1308, 1318, 1324 may be selectively connected to a ground connection (not shown) by creating a conductive trace from the selected planelet vias to a ground connection (not shown) in customization layers (not shown), such as those illustrated in FIGS. 8A through 10B, on one or both sides of probe head base 1330.

In this manner, a semistandard probe head base, such as 1330, may be prefabricated to include many sets of initially inactivated ground planelet sets for altering an impedance of signal vias. Thereafter, the semistandard probe head base can be customized by selectively activating certain sets of ground planelets by connecting the selected sets of planelets to ground and thereby altering the impedance of associated signal vias.

Although application of the invention has been discussed above with respect to what might be considered a standard probe card design consisting of a printed circuit board and a probe head, the principles of the invention may be advantageously applied to a variety of probe card designs. Indeed, the invention does not require application to any particular probe card type or design, but is broadly applicable to all probe card types and designs.

Figure 14:
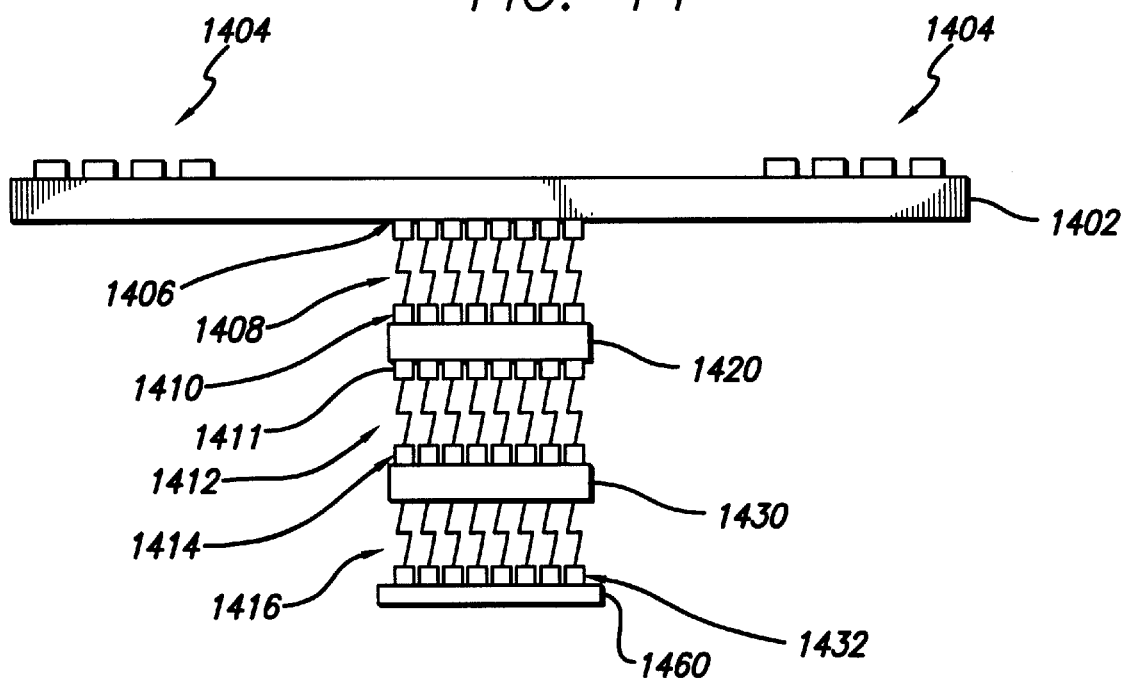
FIG. 14 illustrates a probe card assembly that includes an interposer.

A probe card having an interposer is one nonexclusive example of another probe card design to which the invention may be advantageously applied. As illustrated in FIG. 14 and described in U.S. Pat. No. 5,974,662, which is incorporated herein in its entirety by reference, such a probe card includes an interposer 1420 located between a printed circuit board 1402 and a probe head 1430. The printed circuit board 1402 may be a conventional printed circuit board having tester contacts 1404 for making electrical connections with a tester (not shown). The tester contacts 1404 are electrically connected to contacts 1406, which in turn are electrically connected to contacts 1410 on the interposer 1420 through interconnections 1408. Contacts 1410 on one side of the interposer 1420 are electrically connected to contacts 1411 on the other side of the interposer 1420, preferably by vias (not shown). Interconnections 1412 electrically connect contacts 1411 on the interposer 1420 to contacts 1414 on the probe head 1430, which in turn are connected, preferably by vias (not shown) to probes 1416. Probes 1416 make electrical connections to test points 1432 on a semiconductor device under test 1460. Interconnections 1408 and 1412 are preferably resilient spring-like interconnection elements, examples of which are described in the above mentioned U.S. Pat. Nos. 5,476,211, 5,917,707, and 6,184,053 B1. Probes 1416 may also be resilient spring-like interconnection elements.

Printed circuit board 1402 may be similar to printed circuit board 602, discussed above with reference to FIG. 6. Likewise, probe head 1430 may be similar to probe head 630, also discussed above with reference to FIG. 6. Like probe head 630 or 1430, interposer 1420 may be formed of a ceramic material with electrically conductive vias passing there through and, optionally, terminating in electrically conductive terminals on one or both sides of the interposer.

The probe card illustrated in FIG. 14 may be constructed in accordance with the principles discussed above and illustrated in FIGS. 4–13B. That is, one or more of the printed circuit board 1402, interposer 1420, and probe head 1430 may be prefabricated to one or more full standard designs, and one or more of the other of the printed circuit board, interposer, and probe head may be prefabricated to one or more semistandard designs. Then, upon receipt of data regarding a particular semiconductor design and tester and test algorithms for testing the semiconductor, prefabricated full standard and/or prefabricated semistandard printed circuit board 1402, interposer 1420, and probe head 1430 are selected, and the semistandard elements are customized to semiconductor design, tester, and test algorithms. Any of the methods for customization discussed above may be used. For example, customization layers, such as 802, 950, and 1050, may be added to either surface of the printed circuit board 1402, the interposer 1420, and/or the probe head 1430. In a preferred embodiment, the printed circuit board 1402 and the interposer 1420 are full standard, and customization is added only to the probe head 1430.

Figure 15:
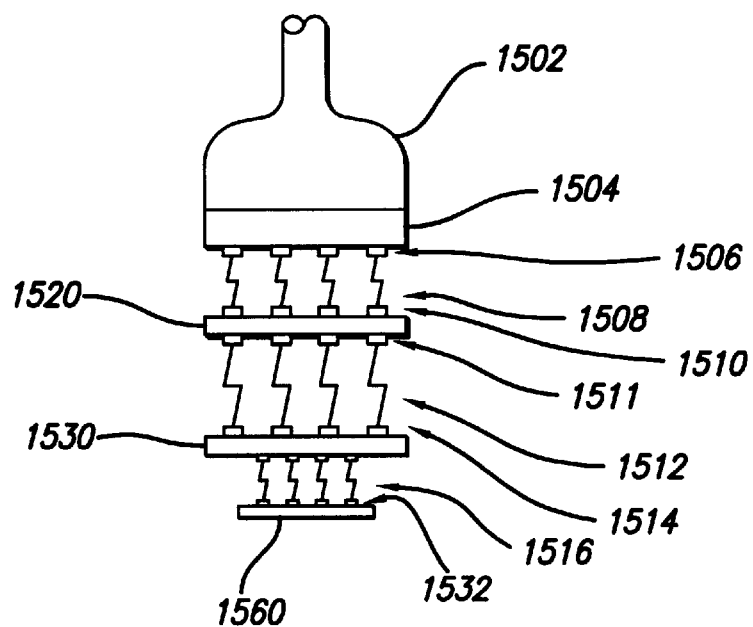
FIG. 15 illustrates a probe card assembly that includes a tester cable interface.

FIG. 15 illustrates another nonexclusive example a probe card design to which the invention may be advantageously applied. In FIG. 15, a tester cable 1502 (which is connected to a tester not shown in FIG. 15) is electrically connected to a cable interface 1504. Contacts 1506 on the cable interface 1504 are electrically connected to contacts 1510 on an interposer 1520 by interconnections 1508, which preferably are resilient spring-like interconnections, such as those described in the above mentioned U.S. Pat. Nos. 5,476,211, 5,917,707, and 6,184,053 B1. Contacts 1511 on interposer 1520 are likewise connected to contacts 1514 on probe head 1530 by interconnections 1512 that are preferably resilient spring-like interconnections. Probes 1516 on probe head 1530 are arranged to contact test points 1532 on a semiconductor device under test 1560. This and similar probe card assemblies are described in copending patent application titled "High Density Planar Electrical Interface" by Benjamin N. Eldridge and Charles A Miller, filed Jun. 20, 2001 with an attorney docket number 003401.P097, which is incorporated herein by reference in its entirety.

The probe card assembly illustrated in FIG. 15 may be constructed in accordance with the principles discussed above and illustrated in FIGS. 4–13B. That is, one or more of the cable interface 1504, interposer 1520, and probe head 1530 may be prefabricated to one or more full standard designs, and one or more of the other of the cable interface, interposer, and probe head may be prefabricated to one or more semistandard designs. Then, upon receipt of data regarding a particular semiconductor design and tester and test algorithms for testing the semiconductor, prefabricated full standard and/or prefabricated semistandard cable interface 1504, interposer 1520, and probe head 1530 are selected, and the semistandard elements are customized to semiconductor design, tester, and test algorithms. Any of the methods for customization discussed above may be used. For example, customization layers, such as 802, 950, and 1050, may be added to either surface of the cable interface 1504, the interposer 1520, and/or the probe head 1530. In a preferred embodiment, the cable interface 1504 and the interposer 1520 are full standard, and customization is added only to the probe head 1530.

Various modifications to the probe card assembly illustrated in FIG. 15 are possible, including without limitation, removing the interposer 1520 such that the cable interface 1504 and the probe head 1530 are directly connected rather than being connected through an interposer. The principles of the present invention are applicable to this and similar variations of the probe card assembly illustrated in FIG. 15.

Other probe card types or designs to which the principles of this invention may be advantageously applied include, with limitation: a probe assembly with a silicon-based probe head, such as is described in the above-mentioned U.S. patent application Ser. No. 09/042,606; and a probe assembly with multiple interposers, such as is described in U.S. patent application Ser. No. 09/528,064, filed Mar. 17, 2000, which is incorporated herein by reference herein in its entirety.

Having thus described exemplary embodiments and applications of the invention, it should be apparent that various modifications, adaptations, and alternative embodiments and applications may be made within the scope and spirit of the invention. The invention is intended to be limited only by the following claims.

What is claimed is:

1. A method of making a probe card assembly comprising:
   providing a first component of said probe card assembly as a premanufactured component, said first component comprising a predetermined wiring pattern with contacts on a surface of said first component,
   thereafter receiving design data regarding a semiconductor device to be tested by said probe card assembly, said design data including locations of test points on said semiconductor device,
   adding one or more customization layers to said surface of said first component,
   adding a plurality of probes for contacting said test points on said semiconductor device to an outer one of said customization layers, said customization layers electrically connecting selected ones of said contacts on said surface of said first component with selected ones of said plurality of probes, and
   combining said first component with at least one other component to form said probe card assembly.

2. The method of claim 1 further including customizing another surface of said first component in accordance with said design data.

3. The method of claim 1, wherein at least one of said test points protrudes from a surface of said semiconductor device, and said plurality of probes includes at least one corresponding probe configured to contact said protruding test point.

4. The method of claim 3, wherein said at least one corresponding probe is selected from a group consisting of a pad, a recess, and a socket.

5. The method of claim 1, wherein said customization layers include at least one embedded electrical circuit element.

6. The method of claim 1, wherein said step of providing said first component further includes providing a plurality of said first components each premanufactured in accordance with one of a plurality of predetermined designs.

7. The method of claim 6, further including, before performing said steps of adding one or more customization layers and adding a plurality of probes, selecting one of said plurality of said first components in accordance with said design data.

8. The method of claim 1 further comprising providing at least one additional component of said probe card assembly as a premanufactured component, said premanufactured component being premanufactured in accordance with a predetermined design for said premanufactured component.

9. The method of claim 8, wherein said combining step further includes combining said at least one premanufactured component with said first component.

10. The method of claim 8 further comprising, after receiving said design data, customizing said at least one premanufactured component in accordance with said design data, and wherein said combining step further includes combining said at least one premanufactured component with said first component.

11. The method of claim 8, wherein said at least one additional component is one of a probe head, a printed circuit board configured to make electrical connections with a semiconductor tester, an interposer, and an interface with a cable from a semiconductor tester.

12. The method of claim 8, wherein at least one of said first component and said at least one additional component comprises a substrate and a plurality of embedded planelets.

13. The method of claim 12, wherein said step of customizing further includes electrically connecting selected ones of said planelets.

14. The method of claim 12, wherein ones of said planelets are electrically connected to a first voltage level, and others of said planelets are electrically connected to a second voltage level.

15. The method of claim 14, wherein said first voltage level is ground.

16. The method of claim 12, wherein sets of said plurality of planelets are disposed to decouple a power source.

17. The method of claim 12, wherein said planelets are disposed so as to affect an impedance of at least one signal path within said at least one of said first component and said at least one additional component.

18. The method of claim 17, wherein said step of customizing further includes activating selected ones of said planelets.

19. The method of claim 12, wherein at least one of said first component and said at least one additional component comprises a substrate and a plurality of imbedded circuit elements.

20. The method of claim 19, wherein said step of customizing further includes activating selected ones of said circuit elements.

21. The method of claim 1, wherein said combining step is performed before at least one of said step of adding one or more customization layers and said step of adding a plurality of probes.

22. The method of claim 1, wherein said customization layers include at least two layers, and said layers are added to said first component one layer at a time.

23. The method of claim 1, wherein said customization layers include at least two layers, and said layers are formed apart from said first component and then joined to said first component.

24. A probe card assembly made using the method of one of claims 1 through 23.

* * * * *